United States Patent [19]
Maracas et al.

[11] Patent Number: 5,937,758
[45] Date of Patent: Aug. 17, 1999

[54] MICRO-CONTACT PRINTING STAMP

[75] Inventors: George N. Maracas, Phoenix; Timothy P. Burgin, Chandler; Thomas M. Mance, Phoenix, all of Ariz.

[73] Assignee: Motorola, Inc., Schaumburg, Ill.

[21] Appl. No.: 08/978,797

[22] Filed: Nov. 26, 1997

[51] Int. Cl.[6] ........................................... B41K 1/38
[52] U.S. Cl. ......................... 101/327; 101/382.1
[58] Field of Search .................. 101/327, 382.1, 101/333, 334, 383, 401.1, 376, 378; 156/655.1; 435/174, 180, 240.22

[56] References Cited

U.S. PATENT DOCUMENTS 5,669,303  9/1997  Maracas et al. .................. 101/327

OTHER PUBLICATIONS

Kumar et al., "Patterned Self–Assembled Monolayers: Applications in Materials Science." Langmuir, Feb. 1994.

*Primary Examiner*—Christopher A. Bennett
*Attorney, Agent, or Firm*—Eugene A. Parsons; William E. Koch

[57] ABSTRACT

A micro-contact printing stamp (100) includes a flexible layer (104) made from an elastomer and having a stamping surface (105). Flexible layer (104) is attached to a support structure (102).

8 Claims, 4 Drawing Sheets

MICRO-CONTACT PRINTING STAMP

RELATED APPLICATION

Related subject matter is disclosed in U.S. patent application Ser. No. 08/608,022, filed Mar. 4, 1996, assigned to the same assignee, and which is hereby incorporated by reference.

FIELD OF THE INVENTION

The present invention pertains to the areas of microelectronic devices, sensors, and optical elements and more particularly to an apparatus for stamping the surface of an article in a reproducible fashion.

BACKGROUND OF THE INVENTION

Prior art methods of patterning (etching or plating) surfaces with micron or sub-micron features include irradiative lithographic methods such as photolithography, electron-beam lithography, and x-ray lithography. The equipment used in conventional irradiative lithographic methods do not easily form large-area devices; they are limited to the fabrication of small-area devices which must subsequently be stitched together if a large-area device is to be fabricated. Typically, the largest area field that can presently be fabricated by a panel printer has a maximum area of about 12 in$^2$, and a typical photolithographic printer for semiconductor applications has a field area on the order of 1 in$^2$. The stitching process is costly and time-consuming.

Accordingly, there exists a need for an improved apparatus and method for patterning large area surfaces with sub-micron features, which easily, economically, and reproducibly prints large-area devices, thereby providing high throughput.

Photolithographic aligners are known in the art. They are designed to align hard masks, which are rigid and planar. This is accomplished by aligning one or more alignment patterns on the hard mask with the corresponding one or more alignment patterns on the surface to be patterned. Thus, the pattern on the mask is brought into registration with the pattern on the surface. The alignment is accomplished by making the necessary displacements of the entire hard mask. Since the hard mask is not deformable, it does not tend to bow or otherwise mechanically distort in a manner which can distort the pattern of the mask.

The alignment and contact printing process in photolithographic equipment includes several steps. The mask is placed in a photomask holder. The substrate to be patterned, or wafer, is placed on a vacuum chuck, which includes a plate having holes in it. When the article is placed on a surface of the vacuum chuck, it is held in place by suction through the holes in the plate. The hard mask is then positioned above, and parallel to, the wafer, within several hundred microns. A prealignment is performed wherein one or more alignment patterns on the hard mask are brought into registration with one or more corresponding alignment patterns on the surface of the article. Depending on the geometry of the corresponding patterns, one or two pairs of alignment patterns are sufficient to bring the stamp printing pattern into registration with the overall wafer pattern. One or two pairs of alignment patterns are sufficient to provide alignment regardless of the size of the mask because the mask is rigid. The alignment is accomplished by detecting the relative positions of the alignment patterns and making the necessary adjustments in the position of the hard mask and/or wafer by making x-y adjustments and angular/rotational adjustments in position. When alignment is achieved, the hard mask and article are brought into contact. The printing gap between the mask and wafer is about 0–50 micrometers: hard contact is achieved by providing a high vacuum between the mask and wafer; soft contact is achieved by providing a low vacuum, about 50–500 mm Hg. It is recognized in the art that abrupt pressure change to vacuum conditions can trap gas between the mask and wafer. However, the solution is generally a step change from large-gap/high-pressure to soft-contact/low pressure followed by a delay for gas release through a valve; thereafter, hard-contact/vacuum are provided by dialing in the desired distance and, optionally, by flowing a stream of inert gas, at a given flow rate, from the underside of the wafer on the wafer chuck.

Micro-contact printing of self-assembled molecular monolayers (SAMs) is known in the art. The SAMs are comprised of molecules, which have a functional group that binds to certain types of solids. The remainder of the molecule (usually a long-chained hydrocarbon) interacts with neighboring molecules to form a dense structure which is impenetrable by certain chemical species. Current micro-contact printing methods for producing a SAM on a surface cannot reliably or reproducibly print surfaces, particularly large-area surfaces having surface areas greater than about 1 in$^2$.

Accordingly, another purpose of the present invention is to provide a cost-effective, reproducible method for patterning large-area surfaces using micro-contact printing of self-assembled molecular monolayers.

BRIEF DESCRIPTION OF THE DRAWINGS

Referring to the drawings.

Figure 1:
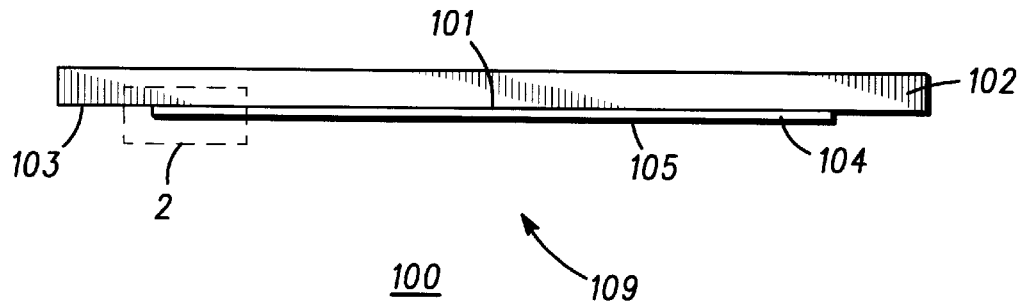
FIG. 1 is a cross-sectional view of an embodiment of a micro-contact printing stamp in accordance with the invention.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DESCRIPTION OF THE PREFERRED EMBODIMENTS

The micro-contact printing stamp of the invention includes an elastomer stamp, which has attached thereto a support structure. The support structure reduces bowing of the stamp and reduces distortion of a stamping pattern formed in the elastomer stamp. The support structure is preferably made from a transparent material having a low thermal expansion coefficient, such as glass, quartz, and the like. The micro-contact printing apparatus of the invention includes the micro-contact printing stamp and further includes parallelizing means for configuring a surface of a substrate substantially parallel to a stamping surface of the micro-contact printing stamp. In the preferred embodiment the parallelizing means includes upper and lower spring-loaded members, which are connected to a vacuum chuck.

The vacuum chuck is designed to hold the substrate, which is to be printed. The parallelizing means allows uniform pattern transfer to occur from the stamping surface and the surface of the substrate.

FIG. 1 is a cross-sectional view of an embodiment of a micro-contact printing stamp 100 in accordance with the invention. Micro-contact printing stamp 100 includes a flexible layer 104 and a support structure 102. A first surface 101 of flexible layer 104 is attached to support structure 102. Flexible layer 104 further includes a stamping surface 105, which opposes first surface 101. An exposed surface 103 of support structure 102 and stamping surface 105 define a major surface 109 of micro-contact printing stamp 100.

Flexible layer 104 is made from a flexible material. Preferably, flexible layer 104 is made from an elastomeric material. Most preferably, flexible layer 104 is made from polydimethylsiloxane (PDMS). Stamping surface 105 defines a stamping pattern, which is to be transferred to the surface of a substrate.

Figure 2:
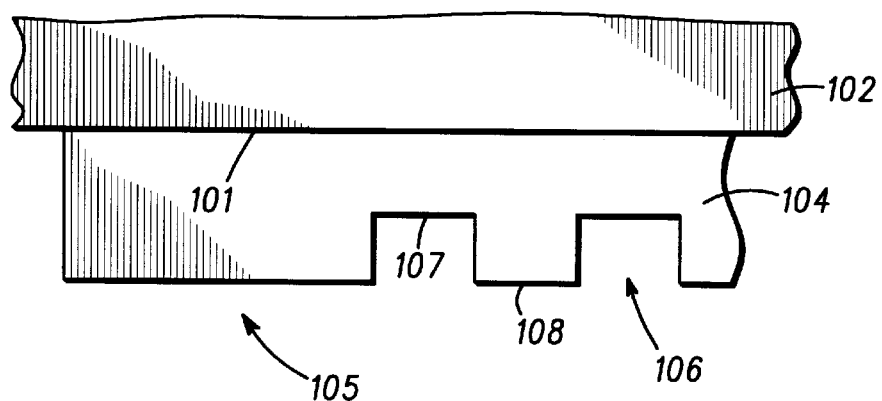
FIG. 2 is a partial, enlarged view of the micro-contact printing stamp of FIG. 1.

An exemplary stamping pattern is illustrated in FIG. 2, which is a partial, enlarged view of micro-contact printing stamp 100. In general, the stamping pattern has micron and/or sub-micron features. Preferably, the features have characteristic dimensions of less than 10 micrometers. Most preferably, the features have characteristic critical dimensions of less than one micrometer. Stamping surface 105 defines a plurality of contact surfaces 108 and a plurality of recessed surfaces 107, which define a plurality of depressions 106.

Uniform pattern transfer from stamping surface 105 to the surface of a substrate is achieved when plurality of contact surfaces 108 makes undistorted physical contact with the surface of the substrate, while recessed surfaces 107 do not make physical contact with the surface of the substrate. The undistorted physical contact results in transfer of the stamping pattern, undistorted, to the surface of the substrate.

Due to the elasticity and/or local strain of flexible layer 104, runout or local deformations can occur in flexible layer 104. By attaching flexible layer 104 to support structure 102, runout and local deformations are drastically reduced, and the stamping pattern of stamping surface 105 is maintained. Support structure 102 is made from a semi-rigid material, such as glass, quartz, plastic, metal, and the like. Preferably, support structure 102 is made transparent for alignment purposes. Support structure 102 provides a drastic decrease in runout, enhanced reproducibility in pattern production, and a decrease in the structural relaxation of recessed surfaces 107 onto a substrate surface during stamping. In a representative configuration of micro-contact printing stamp 100, support structure 102 has a thickness within a range of 0.15–2.54 centimeters, and flexible layer 104 has a thickness within a range of 1–10,000 micrometers. The diameter of support structure 102 can be, for example, within a range of 25.4–127 cm.

Figure 3:
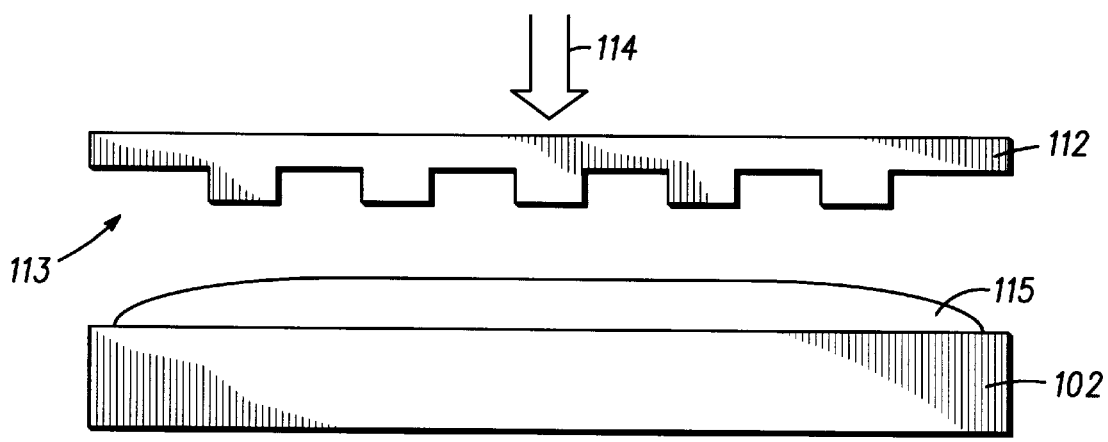
FIG. 3 is a side elevational view of an apparatus for making a micro-contact printing stamp in accordance with the invention.

FIG. 3 is a side elevational view of an apparatus for making micro-contact printing stamp 100. In the embodiment of FIG. 3, flexible layer 104 is made from PDMS, which is commercially available in liquid form. The PDMS-containing liquid is first placed in a low pressure atmosphere, which has a pressure suitable to remove air bubbles, which may be entrapped within the liquid. The de-gassed, uncured elastomer is then poured onto a clean surface of support structure 102, which, in this example, is a plate of glass, to form an uncured elastomer layer 115.

An etched plate 112 is provided, which has a pattern etched into a surface. The pattern of etched plate 112 is the complement of the stamping pattern of stamping surface 105. To make etched plate 112, a tantalum silicide layer is formed on a surface of a silicon substrate, on the side that is to be patterned. The tantalum silicide functions as an etch stop. A layer of silicon dioxide is formed on the tantalum silicide layer. A dry etch procedure is used to pattern the silicon dioxide layer, thereby forming a patterned surface 113. Patterned surface 113 has the appropriate aspect ratio of width to depth for the desired pattern. Patterned surface 113 of etched plate 112 is then treated with a release agent to lower its surface energy. This can be done, for example, by treating patterned surface 113 with tridecafluoro-1,1,2,2-tetrahydrotrichlorosilane, which can be applied using a vapor deposition technique.

Patterned surface 113 is then impressed into uncured elastomer layer 115. A weight, represented by an arrow 114 in FIG. 3, is placed on etched plate 112 to maintain contact with uncured elastomer layer 115. Then, the elastomer is cured by heating to a temperature within a range of about 25–120° C. After the elastomer is cured, etched plate 112 is removed, and the excess elastomer is trimmed away. During the curing step, the PDMS also bonds to the glass. Preferably, the nominal thickness of flexible layer 104 is about 10 microns, but can be thicker or thinner, depending upon the pattern.

Figure 4:
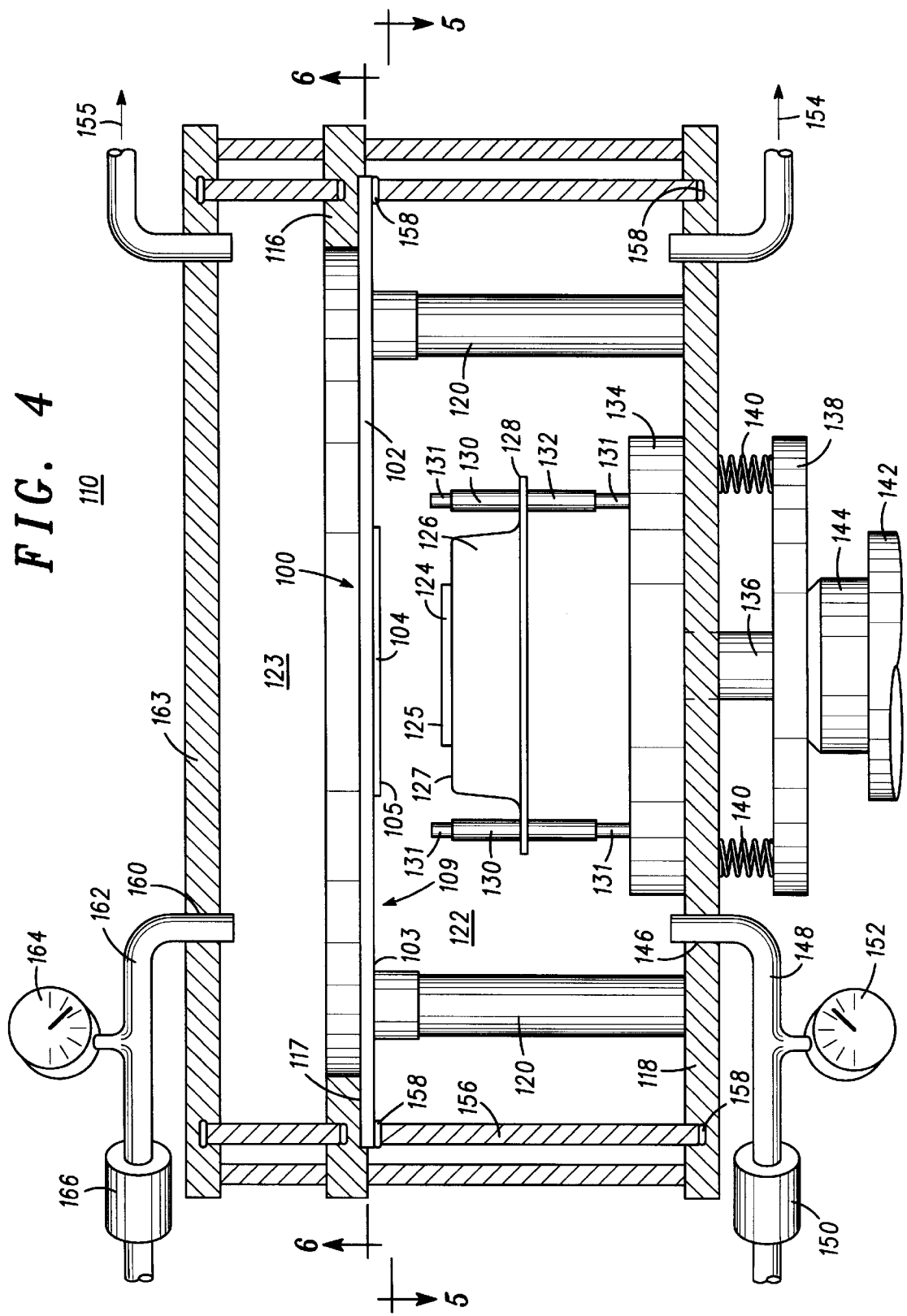
FIG. 4 is a cross-sectional view of a micro-contact printing apparatus in accordance with the invention.

FIG. 4 is a side elevational view of a micro-contact printing apparatus 110 in accordance with the invention. Micro-contact printing apparatus 110 includes micro-contact printing stamp 100, which is used to stamp a surface 125 of a substrate 124. One of the benefits of micro-contact printing apparatus 110 is that it allows adjustment of the relative position of surface 125 of substrate 124 with respect to stamping surface 105 in a manner which promotes uniform pattern transfer from stamping surface 105 to surface 125. For example, micro-contact printing apparatus 110 positions surface 125 substantially parallel to stamping surface 105 just prior to stamping. Also, during the step of contacting stamping surface 105 with surface 125 of substrate 124, micro-contact printing apparatus 110 adjusts the relative position of surface 125 with respect to stamping surface 105 in a manner that tends toward pressure uniformity across stamping surface 105. This promotes uniform and reproducible transfer of the printing pattern.

Adjustment of the relative position of surface 125 with respect to stamping surface 105 may be required, for example, if the planes defined by surface 125 and stamping surface 105 are not initially oriented substantially parallel to each other due to, for example, the configuration of other elements in micro-contact printing apparatus 110.

As illustrated in FIG. 4, micro-contact printing apparatus 110 includes a first platform structure 126, which has a top surface 127 for holding substrate 124. In the preferred embodiment of FIG. 4, first platform structure 126 is a vacuum chuck, which is connected to a vacuum line (not shown) for providing suction at top surface 127. Substrate 124 is positioned on the vacuum chuck, so that surface 125 opposes stamping surface 105 of micro-contact printing stamp 100.

First platform structure 126 includes a lip 128, to which are connected a plurality of upper members 130 and a plurality of lower members 132. Upper members 130 ensure self-parallelization of substrate 124 with micro-contact printing stamp 100. They also allow control of the pressure exerted by micro-contact printing stamp 100 on substrate 124, so that this pressure does not become excessive. Excessive pressure results in transferred pattern distortions, such as line width distortions and distortions due to portions of recessed surfaces 107 contacting surface 125. Lower members 132 allow for equilibration of the pressure exerted by micro-contact printing stamp 100 across surface 125, and they aid in the self-parallelization of substrate 124 with micro-contact printing stamp 100.

In the preferred embodiment, upper members 130 and lower members 132 are adjustable, spring-loaded shock absorbers. Each member 130, 132 has an outer cylinder. A spring is fit snugly within an inner cylinder, which fits snugly within the outer cylinder. A plunger 131 is attached at the outer end of each spring. The springs and plungers are capable of moving up and down, but cannot move laterally. Thus, the heights of upper and lower members 130, 132 are made adjustable. In the preferred embodiment, the force constant of the springs within lower members 132 is greater that the force constant of the springs within upper members 130.

The inner end of each adjustable, spring-loaded shock absorber is mechanically attached to lip 128 of first platform structure 126. Upper members 130 extend between first platform structure 126 to a height slightly above surface 125 of substrate 124. Lower members 132 are positioned one each beneath upper members 130 and extend between first platform structure 126 to a second platform structure 134. These pairs of upper and lower members 130, 132 are disposed about the circumference of first platform structure 126. For example, three pairs of upper and lower members 130, 132 can be attached in an equilateral triangle configuration about a circular first platform structure 126 for supporting first platform structure 126.

Figure 5:
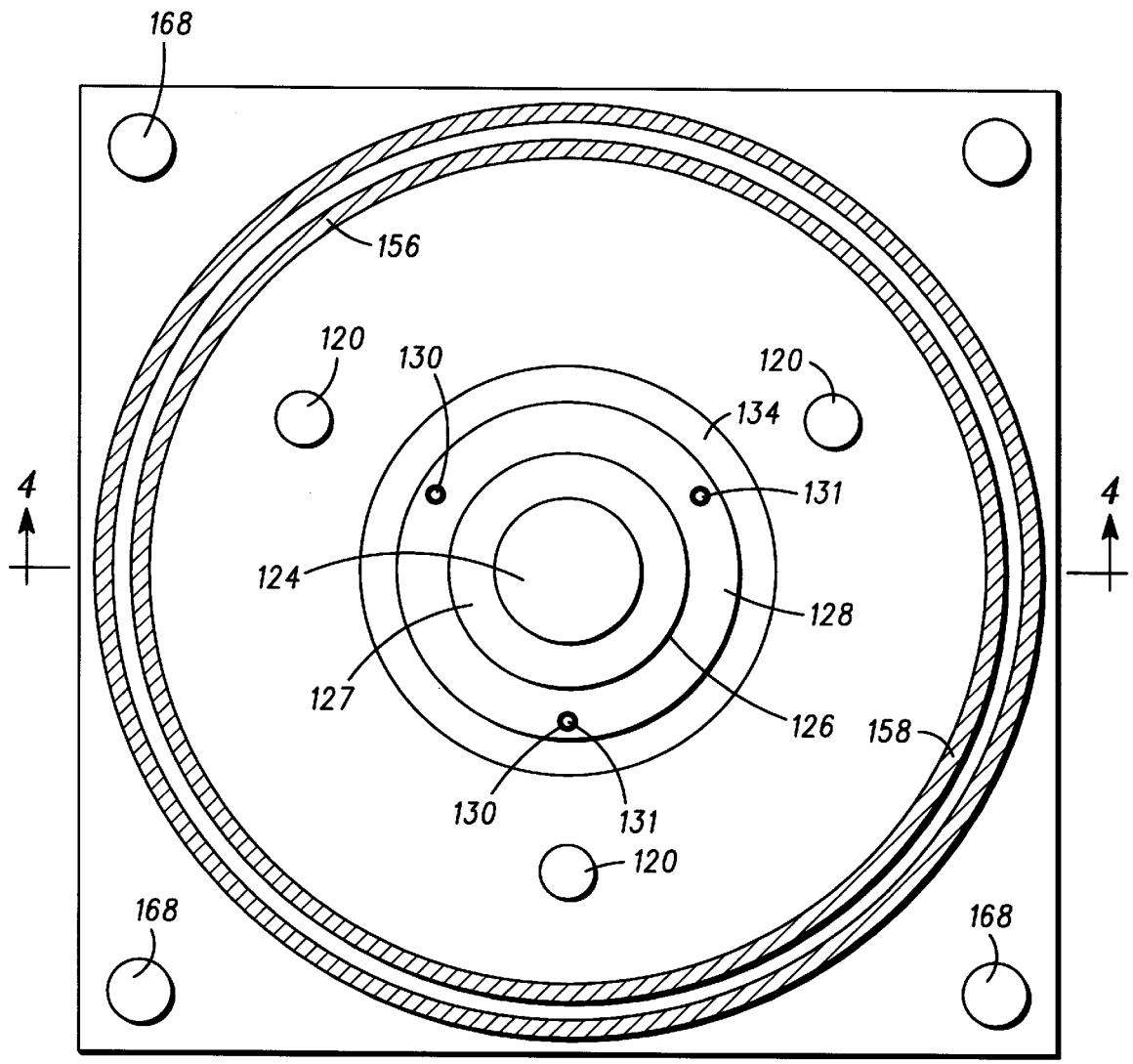
FIG. 5 is a sectional view taken along the section lines 5—5 of FIG. 4.

FIG. 5 is a sectional view taken along the section lines 5—5 of FIG. 4. An equilateral triangle configuration of the pairs of upper and lower members 130, 132 is illustrated in FIG. 5. Further illustrated in FIG. 5 are a plurality of alignment posts 168, which are used to align micro-contact printing stamp 100 with substrate 124.

Referring once again to FIG. 4, plungers 131 of lower members 132 are attached to second platform structure 134, which, in a first configuration, rests on a bottom plate 118 of micro-contact printing apparatus 110. Bottom plate 118 is one of the structures that define a first variable-pressure chamber 122 of micro-contact printing apparatus 110. First variable-pressure chamber 122 is further defined by a plurality of outer walls 156 and by major surface 109 of micro-contact printing stamp 100. First variable-pressure chamber 122 is connected to a vacuum pump (not shown), as indicated by an arrow 154 in FIG. 4.

The pressure in first variable-pressure chamber 122 is reduced using the vacuum pump to a pressure suitable to ameliorate the problem of entrapment of air between surface 125 and stamping surface 105 during the stamping process. An exemplary pressure useful for the embodiment of FIG. 4 is about 150 mmHg. To hold substrate 124, the vacuum applied to the vacuum chuck is at a lower pressure than the pressure within first variable-pressure chamber 122. The pressure within first variable-pressure chamber 122 is monitored with a pressure gauge 152, which is connected to a sampling tube 148. Sampling tube 148 is fed through a hole 146 within bottom plate 118. The pressure can further be adjusted using a valve 150, which is at the end of sampling tube 148.

Figure 6:
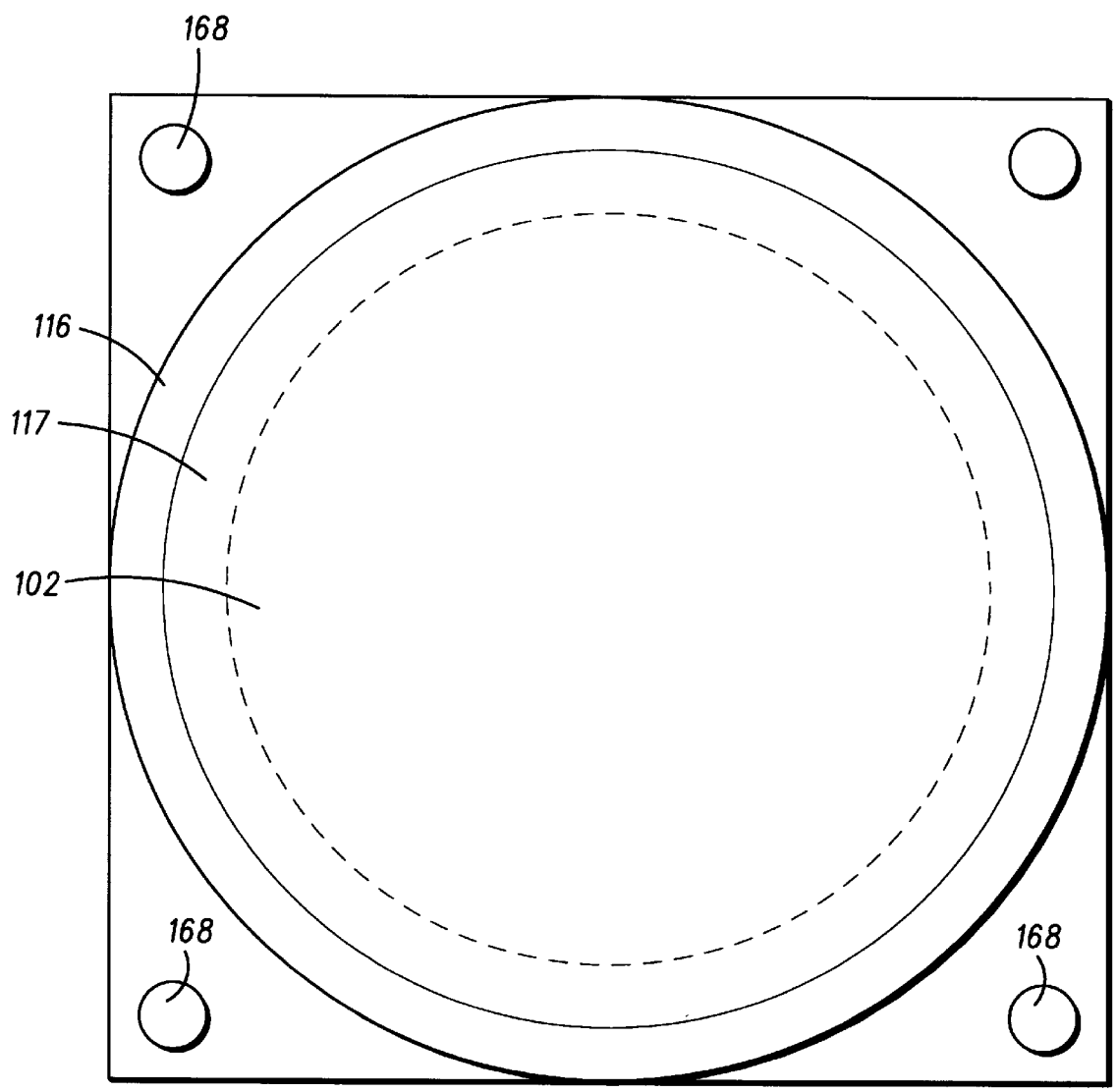
FIG. 6 is a sectional view taken along the section lines 6—6 of FIG. 4.

FIG. 6 is a sectional view taken along the section lines 6—6 of FIG. 4. As shown in FIGS. 4 and 6, an outer portion of support structure 102 of micro-contact printing stamp 100 is sealed to a retaining ring 116. Retaining ring 116 is made from plastic and is about 1.9 cm thick. It has a central hole, the diameter of which is less than the diameter of support structure 102. A central portion of support structure 102 lies within the hole of retaining ring 116. An outer portion of support structure 102 is sealed to a recessed platform 117 of retaining ring 116.

Support structure 102 and retaining ring 116 define a lower surface of a second variable-pressure chamber 123. Second variable-pressure chamber 123 is positioned above micro-contact printing stamp 100. The pressure within second variable-pressure chamber 123 is manipulated to control the configuration of micro-contact printing stamp 100 after the evacuation of first variable-pressure chamber 122. The preferred configuration of micro-contact printing stamp 100 is that which promotes uniform pattern transfer of stamping surface 105 to surface 125 of substrate 124 during the stamping step. Preferably, the pressures within first and second variable-pressure chambers 122, 123 are selected so that micro-contact printing stamp 100 is maintained in a substantially planar configuration.

An exemplary pressure useful for second variable-pressure chamber 123 of the embodiment of FIG. 4 is about 225 mmHg. This pressure varies as the size of the micro-contact printing apparatus is scaled. In the preferred embodiment of a method for micro-contact printing a surface of a substrate in accordance with the invention, the pressures within first and second variable-pressure chambers 122, 123 are constant during the stamping step.

Second variable-pressure chamber 123 is connected to a vacuum pump (not shown), as indicated by an arrow 155 in FIG. 4. The pressure within second variable-pressure chamber 123 is monitored with a pressure gauge 164, which is connected to a sampling tube 162. Sampling tube 162 is fed through a hole 160 within a top plate 163 of micro-contact printing apparatus 110. The pressure therein can further be adjusted using a valve 166, which is at the end of sampling tube 162.

Micro-contact printing apparatus 110 further includes a plate 138, which is coupled to second platform structure 134 via a cylindrical member 136. Plate 138 is connected to the first ends of a plurality of springs 140. The opposing ends of plurality of springs 140 are connected to bottom plate 118, as illustrated in FIG. 4. An air-actuated piston 142 is used to raise plate 138. Cylindrical member 136 is slidably mounted in bottom plate 118, so that, when a head 144 of air-actuated piston 142 lifts plate 138, cylindrical member 136 raises second platform structure 134. In this manner, substrate 124 is advanced toward micro-contact printing stamp 100. Other configurations useful for advancing substrate 124 will occur to those skilled in the art. For example, a hydraulic piston can alternatively be used.

Micro-contact printing apparatus 110 further includes a plurality of compression stops 120, which are positioned one each in radial alignment with the pairs of upper and lower members 130, 132, as illustrated in FIG. 5. Compression stops 120 are cylindrical posts, which extend between micro-contact printing stamp 100 and bottom plate 118.

Compression stops 120 maintain the distance between micro-contact printing stamp 100 and bottom plate 118 at the location of stamping surface 105. When the pressure is reduced within first variable-pressure chamber 122, a plurality of vacuum seals 158 may compress under the load, thereby altering a separation distance between micro-contact printing stamp 100 and bottom plate 118. Compression stops 120 are not affixed with vacuum seals. Compression stops 120 ensure that the compression of plurality of vacuum seals 158 does not affect the separation distance at the location of stamping surface 105. Compression stops 120 provide a constant, repeatable separation distance, which is also independent of the pressure within first variable-pressure chamber 122. They also serve to prevent deformation of micro-contact printing stamp 100 beyond a selected maximum extent.

In a method for micro-contact printing surface 125 of substrate 124, in accordance with the invention, stamping surface 105 is first wetted with a stamping liquid. In the preferred embodiment, it is desired to form a self-assembled monolayer (SAM) on surface 125. Thus, the stamping liquid includes a solution containing a SAM-forming molecular species, such as hexadecanethiol. The particular material comprising surface 125 guides the selection of the SAM-forming molecular species. General descriptions of SAM's and other flexible stamps suitable for use within micro-contact printing apparatus 110 are disclosed in co-pending U.S. patent application Ser. No. 08/608,022, filed Mar. 4, 1996, entitled "Apparatus and Method for Patterning a Surface", which is hereby incorporated by reference.

An exemplary wetting solution is a one millimolar solution of hexadecanethiol in acetone. Stamping surface 105 is soaked in the wetting solution for about 10 minutes. Then, excess solution is removed by rinsing with acetone. Excess acetone is removed by exposure of stamping surface 105 to low vacuum conditions.

Then, the primed micro-contact printing stamp 100 is aligned above substrate 124, above first platform structure 126. Thereafter, first and second variable-pressure chambers 122, 123 are evacuated to established the desired pressures, as described with reference to FIG. 4. Air-actuated piston 142 is used to raise first platform structure 126. The height to which surface 125 of substrate 124 is advanced is predetermined to be slightly beyond the level of stamping surface 105.

Prior to the step of contacting stamping surface 105 with surface 125, plungers 131 of upper members 130 make contact with major surface 109 of micro-contact printing stamp 100. In the embodiment of FIG. 4, plungers 131 make contact at support structure 102. In the example of FIG. 4, this contact occurs when the distance between stamping surface 105 and surface 125 of substrate 124 is about 1.27 millimeters. Variations in the pressure between plungers 131 and support structure 102 cause the heights of upper and lower members 130, 132 to adjust. These adjustments result in a substantially parallel spaced relationship between stamping surface 105 and surface 125 of substrate 124. Then, surface 125 is brought into physical contact with stamping surface 105. After the contact or adhesion is initiated, it is largely self-regulated and continues to propagate between stamping surface 105 and surface 125. Air-actuated piston 142 stops advancing to provide the predetermined displacement of substrate 124.

During the stamping step, pressure variations across stamping surface 105 cause further adjustments in the heights of upper and lower members 130, 132, which adjust the relative position of surface 125 with respect to stamping surface 105. This process proceeds in a manner that tends toward pressure uniformity across stamping surface 105. The characteristics (e.g., spring tension and shock absorption characteristics) and of upper and lower members 130, 132 are selected to result in a final stamping pressure across stamping surface 105, which is sufficient to result in uniform pattern transfer.

After the desired extent of contact between surface 125 and stamping surface 105 has been achieved, they are separated from one another, so that a SAM remains on surface 125. The SAM has the stamping pattern of stamping surface 105.

It is desired to be understood that the structure for detecting the relative positioning of surface 125 with respect to stamping surface 105 is not limited to that described herein. It is further desired to be understood that the structure for detecting and adjusting for pressure variations across stamping surface 105 is not limited to that described herein. Other detection and adjustment elements can be employed. For example, adjustable, spring-loaded shock absorbers can alternatively be attached to the support structure of the micro-contact printing stamp. In another configuration mechanical elements are attached to the substrate for adjusting the position of the substrate in response to signals transmitted from position detectors, which detect the relative position of the substrate surface with respect to the stamping surface.

In summary, the micro-contact printing stamp of the invention includes an elastomer stamp, which has attached thereto a semi-rigid support structure. The support structure reduces bowing of the stamp and reduces distortion of a stamping pattern in the elastomer stamp. The micro-contact printing apparatus of the invention includes the micro-contact printing stamp and further includes parallelizing means for configuring a surface of a substrate substantially parallel to a stamping surface of the micro-contact printing stamp. The parallelizing means promotes uniform pattern transfer from the stamping surface, which has micron and/or sub-micron features, to the surface of the substrate.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

We claim:

1. A micro-contact printing stamp comprising:
    a flexible layer having a first surface and a stamping surface opposing the first surface, the stamping surface defining a plurality of features having characteristic dimensions of less than 100 micrometers, the plurality of features defining a stamping pattern; and
    a support structure chemically bonded to the first surface of the flexible layer
    whereby the support structure reduces deformation of the stamping pattern of the stamping surface.

2. The micro-contact printing stamp as claimed in claim 1, wherein the stamping surface defines a plurality of features having characteristic dimensions of less than 10 micrometers.

3. The micro-contact printing stamp as claimed in claim 2, wherein the stamping surface defines a plurality of features having characteristic dimensions of less than 1 micrometer.

4. The micro-contact printing stamp as claimed in claim 1, wherein the flexible layer is made from an elastomer.

5. The micro-contact printing stamp as claimed in claim 4, wherein the flexible layer is made from polydimethylsiloxane.

6. The micro-contact printing stamp as claimed in claim 1, wherein the support structure is made from a semi-rigid material being selected from a group consisting of glass, quartz, plastic, and metal.

7. The micro-contact printing stamp as claimed in claim 1, wherein the support structure has a thickness within a range of 0.15–2.54 centimeters.

8. The micro-contact printing stamp as claimed in claim 1, wherein the flexible layer has a thickness within a range of 1–10,000 micrometers.

* * * * *